United States Patent [19]

Marks, II et al.

[11] Patent Number: 4,849,940
[45] Date of Patent: Jul. 18, 1989

[54] OPTICAL NEURAL NET MEMORY

[75] Inventors: Robert J. Marks, II; Les E. Atlas; Seho Oh, all of Seattle, Wash.

[73] Assignee: The Washington Technology Center, Seattle, Wash.

[21] Appl. No.: 131,012

[22] Filed: Dec. 10, 1987

[51] Int. Cl.$^4$ ............................................... G11C 7/00
[52] U.S. Cl. ................................... 365/215; 365/234; 364/807
[58] Field of Search ................ 365/64, 125, 215, 234; 364/807; 350/331 R

[56] References Cited

U.S. PATENT DOCUMENTS

| 4,579,421 | 0/0000 | Brown et al. | 350/162.12 |
| 4,586,779 | 0/0000 | Huignard et al. | 350/3.64 |
| 4,762,397 | 8/1988 | Pepper | 350/331 R |

OTHER PUBLICATIONS

Robert J. Marks, II, "Class of Continuous Level Associative Memory Neural Nets," *Applied Optics*, vol. 26, No. 10, May 15, 1987; pp. 2005–2010.
Robert J. Marks, II et al., "Content Addressable Memories: A Relationship between Hopfield's Neural Net and an Iterative Matched Filter," ISDL Report #51887, Interactive System Design Lab, University of Washington, 5/18/87, 26 pages.
Judson G. McDonnell et al., "An Introduction to Neural Networks for Solving Combinatorial Search Problems," ISDL Report #7787, Interactive System Design Lab, University of Washington, 7/7/87, 19 pages.
N. H. Farhat et al., "Optical Implementation of the Hopfield Model," *Applied Optics*, vol. 24, No. 10, May 15, 1985; pp. 1469–1475.
D. Psaltis et al., "Optical Information Processing Based on an Associative-Memory Model of Neural Nets with Thresholding and Feedback," *Optics Letters*, vol. 10, No. 2, Feb. 1985; pp. 98–100.
T. Williams, "Optics and Neural Nets: Trying to Model the Human Brain," *Computer Design*, Mar. 1, 1987; pp. 47–50, 52–55, 58–62.
"Optoelectronics Builds Viable Neural-Net Memory," *Electronics*, Jun. 16, 1986; pp. 41–44.

*Primary Examiner*—Joseph A. Popek
*Attorney, Agent, or Firm*—Christensen, O'Connor, Johnson & Kindness

[57] ABSTRACT

An optical neural net, content addressable memory that does not include electronics or slow optics in the feedback path. The memory comprises an optical vector-matrix multiplier that includes a spatial light modulator and input and output optics, and optical feedback means for returning the outputs of the multiplier to the inputs. Presentation of partial data at selected inputs causes the neural net to iterate at light speed to determine the corresponding output data. An arrangement is described for providing bipolar operations and for letting any group of elements act as the net stimulus.

15 Claims, 5 Drawing Sheets

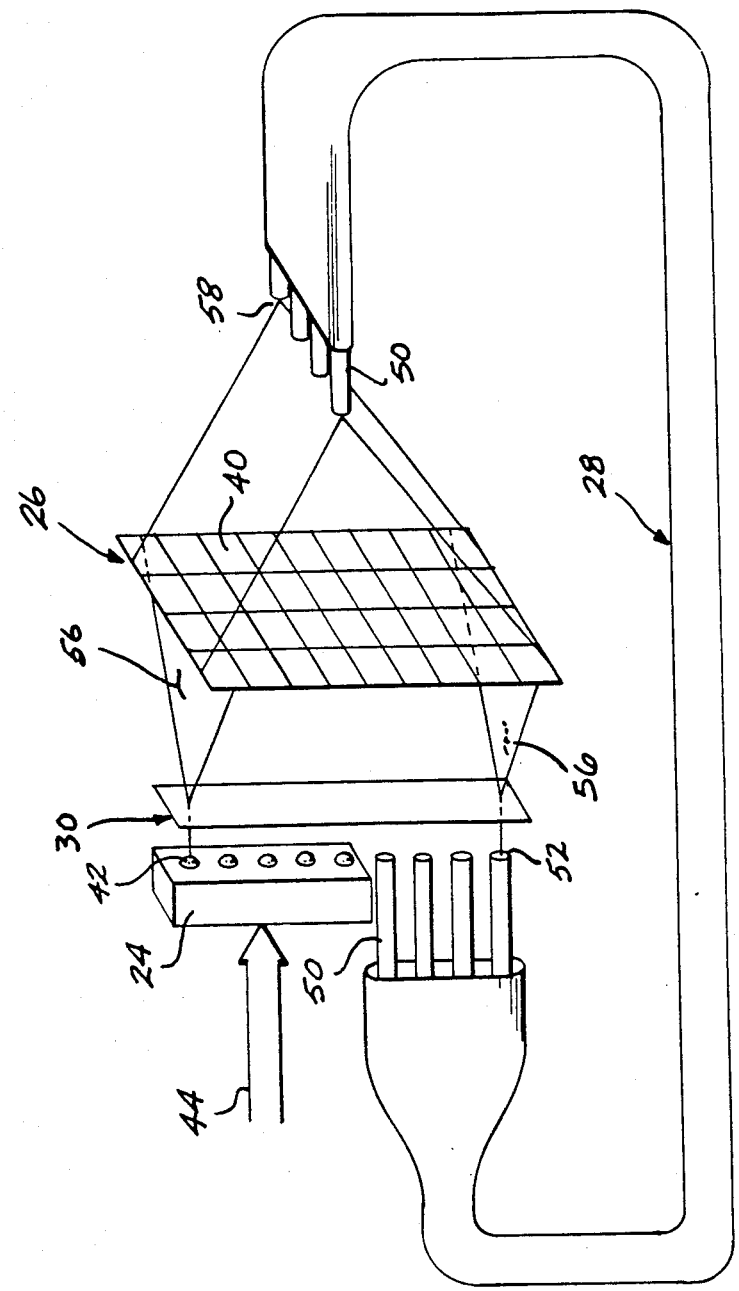

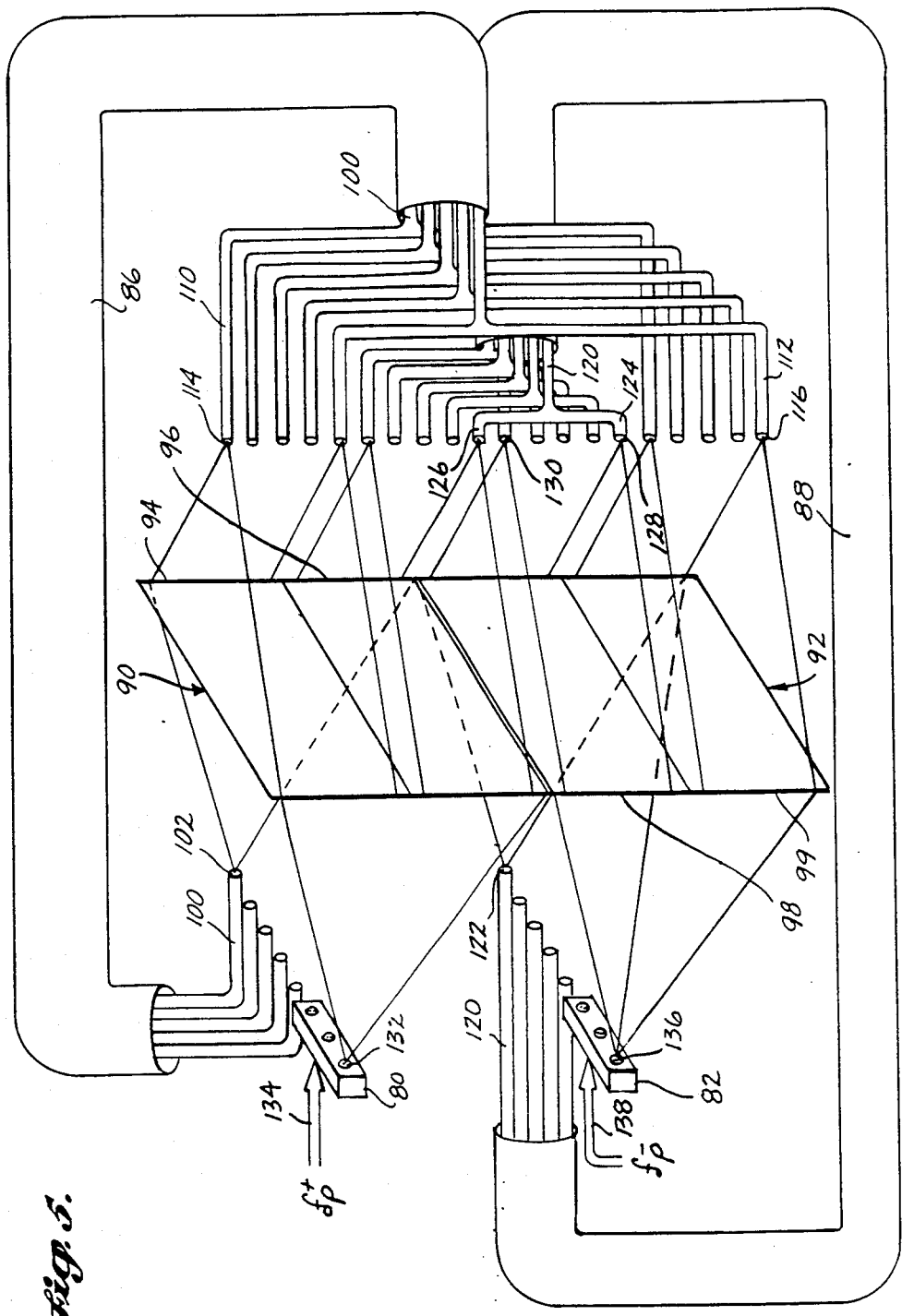

OPTICAL NEURAL NET MEMORY

FIELD OF THE INVENTION

The present invention relates to content addressable memories implemented by means of optical neural nets.

BACKGROUND OF THE INVENTION

An artificial neural net can be described as a data processing system that includes a large number of similar, highly interconnected processors. The term neural refers to the fact that this architecture is similar to that of the human brain, and the individual processors in a neural net are commonly referred to as neurons. In general, each neuron receives signals of varying strengths from a large number of other neurons and combines its input signals in some manner to produce an output signal that is received by a large number of other neurons. Neural nets have been proposed for associative memories, linear programming, analog-to-digital conversion, and for the solution of combinatorial search problems.

SUMMARY OF THE INVENTION

The present invention provides an optical neural net that functions as a content addressable memory, and that does not include any electronics or slow optics (e.g., phase conjugation mirrors) in the feedback path. As a result, the neural net of the present invention can iterate at the speed of light to retrieve data that is addressed by an input signal that comprises a partial data word.

In one preferred embodiment, the neural net memory comprises a spatial light modulator that includes an array of modulator elements arranged in a plurality of rows and one or more columns. It is to be understood that the terms "row" and "column" refer to any pair of nonparallel spatial dimensions, and that these terms are fully interchangeable for describing the present invention. Each modulator element comprises an input aperture, an exit aperture, and means for modulating a property of light received at the input aperture to produce modulated light at the exit aperture. The neural net memory further comprises optical feedback means for combining, for each column, the light exiting from the exit apertures of the elements in that column, to produce an optical feedback signal associated with that column. The memory also includes optical input means for receiving one or more optical input signals and one or more optical feedback signals, and for conveying each input and feedback signal to the input apertures of the elements of an associated row, each input and feedback signal being associated with a different row. Finally, the neural net memory comprises output means for producing output signals that correspond to the feedback signals. In a preferred embodiment, the modulator elements modulate the intensity of light, and data is stored in the neural net memory by specifying the optical transmittance values of the modulator elements. In a further preferred embodiment, bipolar operations are performed by providing interconnected positive and negative subsystems in which the signal intensities represent positive and negative values respectively. Additional features include a method for increasing the storage capacity of the net by the addition of hidden neurons, and a learning method for adding new data to the net.

BRIEF DESCRIPTION OF THE DRAWINGS

FIG. 2 illustrates a neural net content addressable memory in accordance with the present invention;

FIG. 5 illustrates a bipolar neural net content addressable memory in accordance with the present invention;

DETAILED DESCRIPTION OF THE INVENTION

Figure 1:
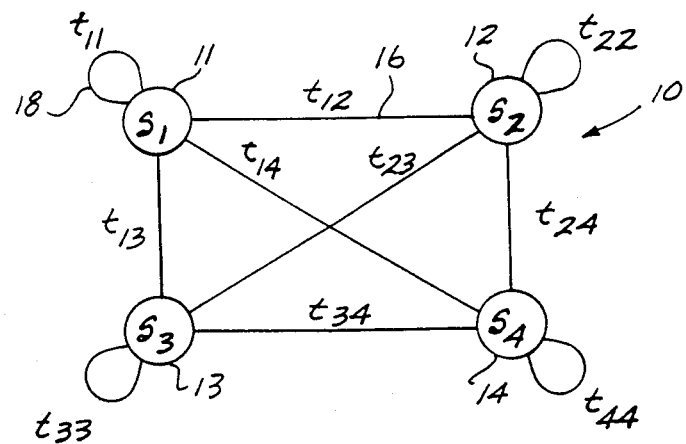
FIG. 1 schematically illustrates the interconnections in a neural network consisting of four neurons.

FIG. 1 illustrates a small neural net 10 comprising four neurons or processors 11–14. Each neuron is connected to all other neurons by interconnections 16, and is connected to itself by connections 18. The state of each neuron is designated $S_k$, where the index k identifies the neuron, i.e., k=1 to 4 in the example of FIG. 1. In general, each $S_k$ is an analog parameter that can take on a continuous range of values. The notation $t_{jk}$ will be used to designate the strength or transmittance of the interconnection between neurons j and k. Each neuron, for example neuron k, receives an input signal from neuron j equal to $t_{jk} S_j$, i.e., the input signal from neuron j is equal to the state of neuron j times the transmittance $t_{jk}$ between neurons j and k. Thus, the total input $i_k$ received by neuron k can be written as $$i_k = \sum_{j=1}^{L} t_{jk} S_j \quad (1)$$

where L is the total number of neurons in the neural net.

Each neuron, either continuously or periodically, updates its state value $S_k$ by summing its inputs to determine $i_k$, and then operating on the $i_k$ value by a node operator $n_k$ to determine its new state value. Thus, if the update operation occurs periodically at times $m\Delta T$, and where $\Delta T$ is the time period between updates, the each neuron performs the iteration:

$$S_k(m + 1) = n_k \sum_{j=1}^{L} t_{jk} S_j(m) \quad (2)$$

If all neurons operate synchronously and if all delays between node pairs ar identical, then Equation (2) can be generalized to:

$$S(m+1) = N \cdot T \cdot S(m) \quad (3)$$

where $S(m+1)$ and $S(m)$ are the neuron state vectors at time indices $m+1$ and m respectively, N is the vector denoting the node operator, and T is an L x L matrix of transmittance values $t_{jk}$. The vector N is a point-wise operator, i.e., element k of $S(m+1)$ depends only upon input sum $i_k$ and $n_k$.

Data may be stored in neural network 10 in the form of the transmittance values $t_{jk}$. In particular, let the data to be stored in the network be represented by a set of R linearly independent vectors $f_r$ of length L, L being greater than or equal to R. The vectors $f_r$ will be referred to as library vectors. These vectors can be assembled into a library matrix F as follows:

$$F = [f_1 : f_2 : \ldots : f_R] \quad (4)$$

It can be shown that the data represented by library vectors $f_r$ can be stored in a neural net by determining the transmittance matrix T as follows:

$$T = F(F^T F)^{-1} F^T \quad (5)$$

Conceptually, the $L \times L$ matrix T formed in accordance with Equation (5) projects any point in the L dimensional state space of the neural net onto the R dimensional subspace spanned by the library vectors.

The present invention utilizes neural net 10 to form a content addressable memory. In one embodiment, it is assumed that the first P elements of vector f are known or specified, and it is desired to determine the remaining Q elements of the library vector that provides the closest match to the P elements of f, where $P+Q=L$. To accomplish this, the node operator N is defined as follows:

$$N \cdot A = [f_P | A_Q]^T \quad (6)$$

where A is any vector, where $f_P$ denotes a vector containing the first P elements of f, and where $A_Q$ contains the last Q elements of A. Thus, the node operator N of Equation (6) forces the first P elements of A to be equal to the known or specified elements $f_p$, and leaves the last Q elements of A uncharged. It can then be shown that the iteration of Equation (3) will converge if P is less than or equal to R, and if the first P rows of F form a matrix of full rank.

It will be noted that for the node operator of Equation (6), some of the operations indicated in Equation (3) are not required, since the node operator replaces the first P elements of the input sum $T \cdot S(m)$ with $f_P$. To take advantage of this fact, one can first rewrite Equation (3) as follows:

$$\begin{bmatrix} S_P(m+1) \\ \overline{S_Q(m+1)} \end{bmatrix} = N \begin{bmatrix} T_P \\ \overline{T_Q} \end{bmatrix} \begin{bmatrix} S_P(m) \\ \overline{S_Q(m)} \end{bmatrix} \quad (7)$$

where $T_p$ and $T_Q$ are the first P and the last Q rows of T, respectively, and $S_p$ and $S_Q$ are the first P and last Q elements, respectively, of the state vectors. For the node operator N of Equation (6), $S_P(m+1)$ is set equal to $f_p$, and, these elements therefore do not need to be calculated. Equation (7) then reduces to:

$$S_Q(m+1) = T_Q \begin{bmatrix} f_p \\ \overline{S_Q(m)} \end{bmatrix} \quad (8)$$

Figure 3:
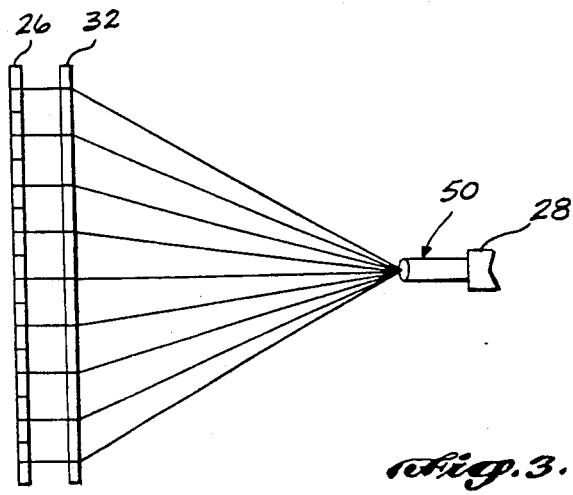
FIG. 3 is a side view of a portion of the neural net of FIG. 2.

An apparatus for implementing Equation (8) in accordance with the present invention is illustrated in FIGS. 2 and 3. The apparatus includes input array 24, spatial light modulator 26, fiber-optic bundle 28, input astigmatic processor 30 and output astigmatic processor 32. Output astigmatic processor 32 is omitted from FIG. 2 to simplify the illustration. The spatial light modulator and the input and output astigmatic processors form an optical vector-matrix multiplier of a type known in the art. For use in the present invention, spatial light modulator 26 is a $Q \times L$ rectangular array of modulator elements 40. Input array 24 comprises a linear array of P LEDGs 42. The input array receives P continous level electrical input signals via bus 44, and connects each electrical input signal to one of LEDs 42, and such that each LED produces an optical input signal that varies in intensity in accordance with the corresponding electrical input signal. As will be clear below, the P signals produced by LEDs 42 represent the vector $f_p$ in Equation (8).

Fiber-optic bundle 28 comprises Q individual fiber-optic cables 50. On the left-hand side of spatial light modulator 26 (as shown in FIG. 2), fiber-optic cables 50 are arranged such that their terminations 52 form an extension of input array 24. The Q fiber-optic cable terminations 52 represents vector $S_Q(m)$ in Equation (8). Spatial light modulator 26 represents the transmittance or interconnect matrix T, and the spatial light modulator together with the input and output astigmatic processors performs the matrix-vector multiplication indicated on the right-hand side of Equation (8). Input astigmatic processor 30 focuses the light from each LED and termination in the vertical direction in FIG. 2, but spreads the light horizontally, so that each LED and termination produces a horizontal sheet or a plane of light, as illustrated by reference numerals 56. To simpify the illustratons, FIG. 2 only illustrates the planes of light from the uppermost LED and the lowermost termination. The divergence angle and thickness of each plane are selected so that the light from each LED or termination is distributed to, and only to, all modulator elements 40 of a corresponding horizontal row of spatial light modulator 26.

Each modulator element 40 includes an input aperture on the side facing input optics 30, and an exit aperture on the side facing output optics 32. Each modulator element modulates a property of the light received at its input aperture, to produce modulated light at its exit aperture. In a preferred embodiment, the modulation consists of modulating the intensity of light, in which case spatial light modulator 26 consists of a sheet or screen on which each area corresponding to one of the modulator elements has a predetermined optical transmittance at the wavelength at which LEDs 42 emit. A photographic negative or the like may be used for the spatial light modulator for applications in which the library vectors do not change. Alternatively, a programmable spatial light modulator may be used in which the transmittance of each modulator element can be controlled by an electrical signal applied to the spatial light modulator. In either case, the modulator elements in each row of spatial light modulator 26 receive the light produced by a corresponding one of LEDs 42 or terminations 52 via input astigmatic optics 30.

Output astigmatic processor 32 is positioned to receive light emerging from the exit apertures of modulator elements 40, and causes light from the modulator elements in a given vertical column of the spatial light modulator to be collected and conveyed to the termination 58 of one of fiber-optic cables 50. Fiber-optic bundle 28 then conveys this light back to terminations 52 to continue the iteration. From the above description, it will be appreciated that the arrangement illustrated in FIGS. 2 and 3 provides an all optical implementation of Equation (8), with LEDs 42 and terminations 52 representing $f_P$ and $S_Q(m)$, respectively, spatial light modulator 26 representing transmittance matrix $T_Q$, and the signals produced at terminations 58 representing $S_Q(m+1)$. However, unlike prior implementations of the illustrated vector-matrix multiplier, the iteration is performed continuously at the speed of light, and the apparatus does not include any electronics or slow optics (e.g., phase conjugation mirrors) in the feedback path.

Figure 4:
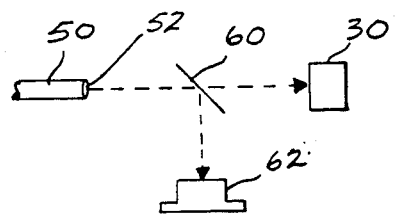
FIG. 4 is a partial schematic view showing the production of one output signal for the neural net of FIG. 2.

Output from the network shown in FIGS. 2 and 3 can be derived by sampling the optical signals passing through fiber-optic bundle 28 at a convenient point in the feedback path. One suitable arrangement is shown in FIG. 4. Light exiting from termination 52 of each fiber-optic cable 50 is passed through a high transmission beamsplitter 60 that reflects a small predetermined fraction of the light towards photodetector 62, and permits the remainder of the light to continue to input astigmatic processor 30.

A practical implementation of the optical neural net must take into account absorptive losses of light as it cycles through the cycle. It can easily be shown that if the number of neurons is much greater than the number of library vectors, i.e., if $L>>R$, then each transmittance value $t_{jk}$ is usually much less than one. This feature provides the ability to compensate for absorptive losses by scaling the elements $t_{jk}$ upward to cancel such losses in each feedback path, without exceeding the maximum passive transmittance value of unity. In this compensation technique, the storage capacity of the network increases as the absorptive losses decrease. Even in those cases in which not all $t_{jk}$ elements are much less than one, the fault tolerance that is inherent in neural networks will generally permit satisfactory operation even if some of the $t_{jk}$ elements are clipped or limited by the scaling process.

For most practical applications, it will be desirable to permit the $T_Q$ matrix and the input $f_p$ to contain both positive and negative numbers. However the incoherent optics in the illustrated implementation can only add and multiply positive numbers. A straightforward solution to this problem is to rewrite each matrix and vector as the sum of a positive and negative matrix or vector as follows:

$$T_Q = T_Q^+ + T_Q^- \quad (9)$$

$$f_p = f_p^+ + f_p^- \quad (10)$$

$$S_Q 0 = S_Q^+ 0 + S_Q^- 0 \quad (11)$$

The matrix $T_Q^+$, for example, is formed by setting all the negative elements in $T_Q$ to zero, whereas $T_Q^-$ is formed by setting all positive elements in $T_Q$ to zero. Similar operations are performed for the vectors $f_P$ and $S_Q$. Equation (8) can then be rewritten as $$S_Q^+(m+1) = T_Q^+ \left[ \frac{f_p^+}{S_Q^+(m)} \right] + T_Q^- \left[ \frac{f_p^-}{S_Q^-(m)} \right] \quad (12)$$

$$S_Q^-(m+1) = T_Q^+ \left[ \frac{f_p^-}{S_Q^-(m)} \right] + T_Q^- \left[ \frac{f_p^+}{S_Q^+(m)} \right] \quad (13)$$

An all optical implementation of Equations (12) and (13) is illustrated in FIG. 5. The neural net includes input arrays 80 and 82, identical spatial light modulators 90 and 92, and fiber-optic bundles 86 and 88. The neural net also comprises input and output astigmatic processors for each spatial light modulator. The processors have been omitted for ease of illustration. Spatial light modulator 90 includes an upper half 94 representing $T_Q^+$, and a lower half 96 representing $T_Q^{-1}$. Each half 94 and 96 includes a $Q \times L$ array of modulator elements similar to that shown in FIG. 2. However in upper half 94, modulator elements corresponding to negative numbers are set to zero, i.e., they transmit no light. Similarly, in the lower half 96 representing $T_Q^-$, modulator elements corresponding to positive numbers are set to zero. In comparison to FIG. 2, the rows and columns of modulators 90 and 92 have been reversed.

Input array 80 comprises P LEDs 132 which are energized in accordance with electrical input signals representing $f_P^+$ on bus 134. Similarly, input array 82 comprises LEDs 136 that are energized in accordance with electrical signals representing $f_P^-$ on bus 138. Fiber-optic cable bundle 86 comprises Q individual fiber-optic cables 100. Each fiber-optic cable 100 includes a termination 102 on the input side of the spatial light modulator 90. The other end of each fiber-optic cable 100 branches, via a suitable fiber optic coupler (not shown) to form fiber-optic cables 110 and 112 that include terminations 114 and 116, respectively, on the output side of the spatial light modulators. Similarly, fiber-optic bundle 88 includes fiber-optic cables 120 that include terminations 122 on the input side of spatial light modulator 92 and that branches at the other end to form fiber-optic cables 124 and 126 that include terminations 128 and 130, respectively, on the output side of the spatial light modulators. In an alternate arrangement, fiber optic cable pairs such as 110 and 112 are not coupled, but their input side terminations are instead positioned immediately adjacent to one another to approximate a single point source similar to termination 122.

Light exiting from each termination 102 and each LED 132 is focused horizontally and spread vertically by the input astigmatic processor, such that the light is directed to, and only to, a single column of spatial light modulator 90. Similarly, light exiting from terminations 122 and LEDs 136 is focused horizontally and spread vertically such that the light is directed to, and only to, one column of spatial light modulator 92. On the output side, light emerging from the exit apertures of the modulator elements in each row of upper half 94 is collected and input into termination 114 of one of fiber-optic cables 110. Termination 116 of the associated fiber-optic cable 112 receives the light emerging from the exit apertures of the modulator element in the corresponding row of lower half 99. In a similar manner, light from the modulator elements in each row of lower half 96 is collected at termination 130 of one of fiber-optic cables 126, and light from the corresponding row of upper half 98 is collected at termination 128 of one of fiber-optic cables 124.

Figure 6:
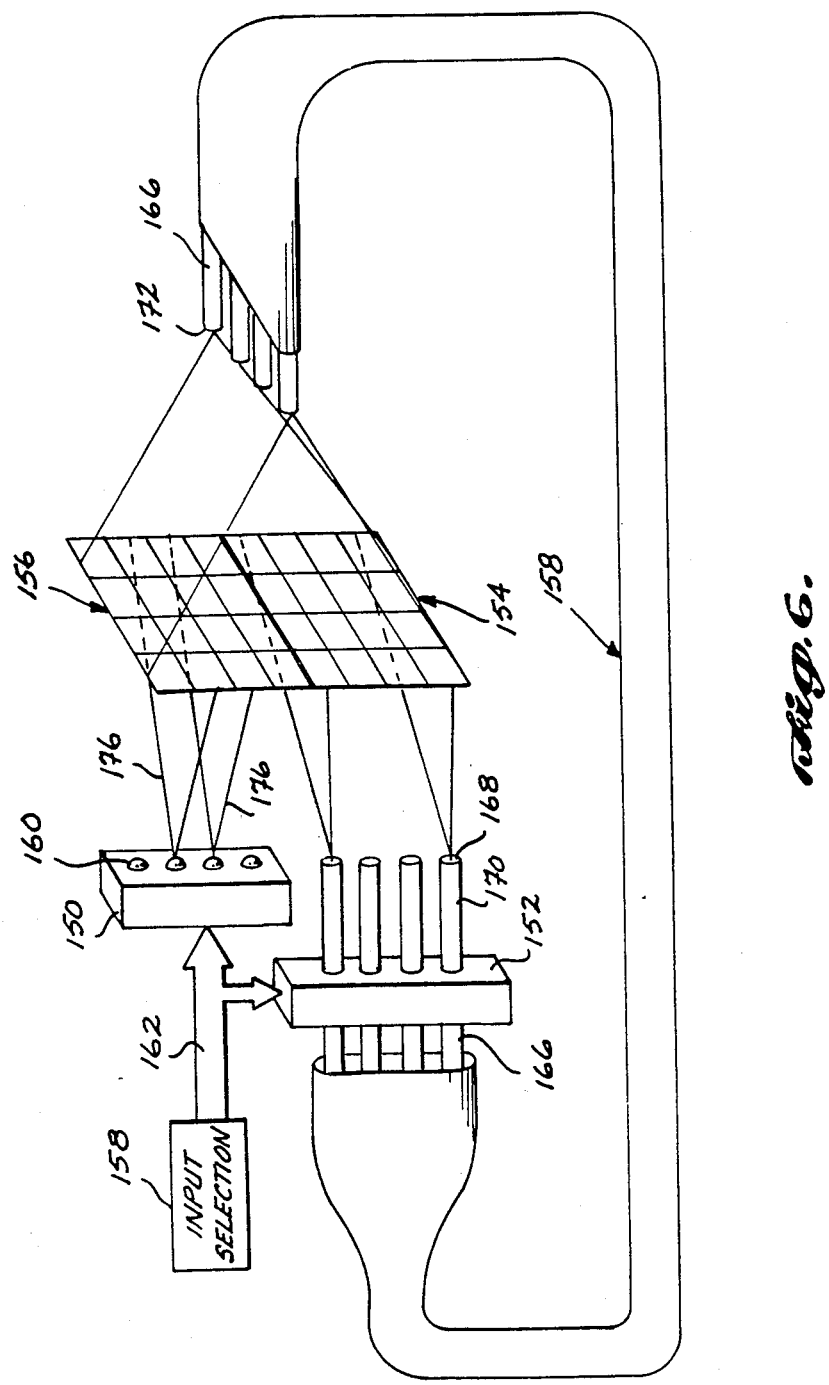
FIG. 6 illustrates a variation of the neural net of FIG. 2 in which the designations of input neurons can be varied.

In the embodiments described above, it has been assumed that the P neurons that provided the stimulus or input signal were represented by the first P neurons of the library vector that was to be retrieved from the neural net. FIG. 6 illustrates a neural network of four neurons (L=4) that is similar to that shown in FIG. 2, but in which any P neurons can act as the net stimulus. The neural net comprises input array 150, switch array 152, spatial light modulators 154 and 156 fiber optic bundle 158, and input selection means 158. The input and output astigmatic processors have again been omitted to simplify the figure. Except as noted below, each spatial light modulator is similar to spatial light modulator 26 of FIG. 2. The input and switch arrays are positioned on the input sides of spatial light modulators 154 and 156. Input array 150 includes four LEDs 160 that may be selectively activated or energized by corresponding electrical input signals received from input selection means via bus 162. For reasons explained below, input selection means 158 also provides signals to switch array 152 that indicate which LED's have been activated. Fiber optic bundle 158 comprises L (i.e., four) fiber optic cables 166. One end of each fiber optic cable 166 terminates in switch array 152, and the switch array either passes or blocks the optical signal from each fiber optic cable 166 to produce an optical feedback signal at termination 168 of corresponding output cable 170. The other end of fiber optic cable 166 includes termination 172 positioned on the output sides of the spatial light modulators.

In the illustrated network, the middle two neuron states are known, and input selection means 158 therefore provides input vector $f_p$ by activating the middle two LEDs 160 in input array 150. As in the neural net of FIG. 2, the input astigmatic processor converts the light from the middle two LEDs into planes of light 176 that strike corresponding rows of spatial light modulator 156. Light from each column of spatial light modulator 156 is collected by the output astigmatic processor and focused onto terminations 172. Switch array 152 blocks light from the fiber optic cables 166 that correspond to the activated LED's, i.e. from the middle two fiber optics cables 166, and permits transmisson of light from the outer two fiber optic cables. The purpose of the switch array is thus to insure that the signals representing the input vector $f_p$ are not contaminated by feedback signals. Switch array 152 can comprises either electro-optic or optic-optic toggle switches that turn off the fiber optic cables corresponding to the locations of the neurons with known states. Such switches can operate in the gigahertz range with small attenuation.

As illustrated in FIG. 6, the output of switch array 152 is multiplied by spatial light modulator 154 in a manner similar to that for spatial light modulator 26 of FIG. 2. Spatial light modulator 154 is also adjusted for feedback losses, in a manner similar to that discussed earlier for the embodiment of FIG. 2. However spatial light modulator 156 is not in the feedback path, and therefore is not adjusted for feedback losses. Thus spatial light modulators 154 and 156 are similar to one another, except that the transmittances of the modulator elements of spatial light modulator 154 are increased to compensate for losses. The superposition of the contributions from spatial light modulators 156 and 154 are collected at terminations 172, and the iteration proceeds at the speed of light. As with the embodiment of FIG. 2, output means can be provided as shown in FIG. 4, and bipolar operations can be implemented by a straightforward extension of the arrangement shown in FIG. 5.

Figure 7:
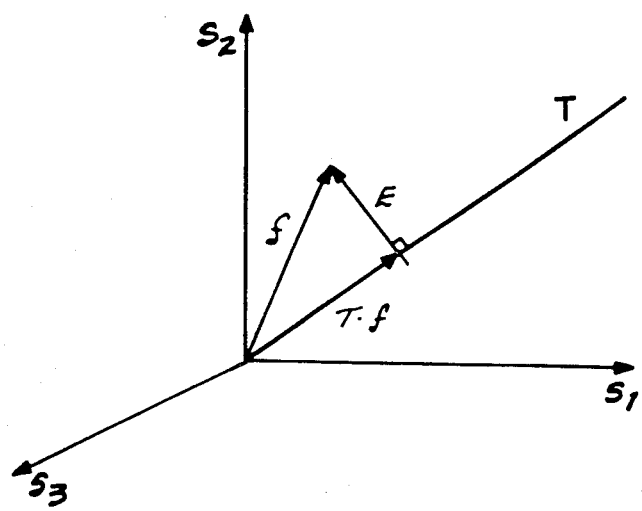
FIG. 7 is a graph illustrating the process of extending the subspace spanned by the interconnect matrix by a means of a new library vector; and, FIG. 8 is a schematic diagram illustrating the use of nonlinear electronics to provide additional input signals for neural nets having hidden layers.

Equation (5) for calculating the transmittance matrix T will in many cases be computationally unacceptable. However, the transmittance matrix can be determined by the neural network of the present invention by providing the network with the new library vectors, one library vector at a time. Assume that a transmittance matrix T is known, and one wishes to update the matrix with a new library vector f. As illustrated in FIG. 7 for a three neuron network, the product T·f projects the new library vector f onto the subspace T, and the vector E $$E = (I - T)f \quad (14)$$

is orthogonal to T, with I representing the identity matrix. One wishes to extend the dimensions of the subspace T by one dimension in the direction of E. The vector E can be easily computed by one synchronous iteration of the neural net after imposing states equal to f on the neurons. The vector E divided by its magnitude will be the unit vector orthogonal to T, and the updated transmittance matrix T+ is therefore $$T^+ = T + \frac{E \cdot E^T}{E^T \cdot E} \quad (15)$$

T+ now projects any vector or subspace onto the new subspace formed by the closure of T and E or, equivalently, T and f. This procedure may be initiated by setting all interconnects set to zero, and is similar to that of the Gram-Schmidt orthonormalization.

If $(I-T)f$ is equal to zero, then library vector f is already in the subspace T, and no updating is required. In practice, computational accuracy will rarely result in an exact equality. Thus if a criteria of exact equality is used, addition of a library vector that is already in the subspace will cause the addition of a new dimension to the subspace in a random direction dictated by computational or other noise. Thus to insure the network is learning something useful, it is advisable to compare the product $E^T E$ to some appropriate threshold prior to updating.

To carry out this learning procedure, the entire input array is excited corresponding to the new library vector, and the vector E is then determined by subtracting the network output from the input, as per Equation (14). The neural interconnects are then updated, using conventional electronics to adjust the transmittance matrix T in accordance with Equation (15). For this technique, the entire transmittance matrix T must be available, rather that just $T_Q$. Furthermore, the source array must be extended to include those neurons whose state is determined by the output neurons, and the output detector means must be extended to include sensing those states normally associated with the input neurons as well as any "hidden" neurons of the type described below.

If there is a single output neuron in a neural net, and the output neural state is known to be either one or minus one, then it can be shown that the sign of the output state is correct after one iteration. By superposition, this result can be extended to an arbitrary number of output neurons, as long as each output neuron was trained only on library vectors consisting of plus one and minus one value. Thus if there criteria are met, the neural net does not require feedback, and the problem of absorptive losses is no longer an issue.

In the embodiments described so far, the number of input-output relationships that can be stored in a network cannot exceed P, the number of states that are specified or known. However, the number of input neurons, and thus the storage capacity of the neural net, can be increased artificially by establishing hidden layers of neurons. As an example, consider the exclusive or (XOR) operation that has the following truth table $$\begin{array}{r|c|c|c|c|}
\text{Input} & 0 & 0 & 1 & 1 \\
\text{Input} & 0 & 1 & 0 & 1 \\
\text{Output} & 0 & 1 & 1 & 0 \\
\end{array} \qquad (16)$$

In each column, the first two numbers represent the inputs, and the third number represents the output. The neural nets described to this point cannot perform the XOR function, because the number of input-output relationships (four) is greater than P, the number of specified input states (two). This can be stated differently by noting that the matrix $F_P$ $$F_p = \begin{bmatrix} 0 & 0 & 1 & 1 \\ 0 & 1 & 0 & 1 \end{bmatrix} \qquad (17)$$

is not full column rank. However, in accordance with a further aspect of the present invention, the matrix $F_P$ is augmented with two new rows, such that the resulting matrix is a full rank. The augmentation cannot be accomplished by synthesizing new rows as linear combinations of the first two rows, because the column rank would not increase. However, almost any nonlinear combination of the first two rows will, in general, increase the matrix rank. As an example, a first additional row can be synthesized by setting each of its values equal to the exponentiation of the sum of the first two rows, and a second new row can be synthesized by setting each of its values equal to the cosine of the sum of the first two rows multiplied by 90°. This choice of nonlinearities is essentially arbitrary. The augmented library matrix $F^+$ is $$F^+ = \begin{bmatrix} 0 & 0 & 1 & 1 \\ 0 & 1 & 0 & 1 \\ 1 & e & e & e^2 \\ 1 & 0 & 0 & -1 \\ 0 & 1 & 1 & 0 \end{bmatrix} \qquad (18)$$

The new value for the number of input states is four, which is equal to the number of input-output relationships. Thus, the new transmittance matrix $T^+$ formed from $F^+$ via Equation (5) will produce a neural net of increased data storage capacity.

Figure 8:
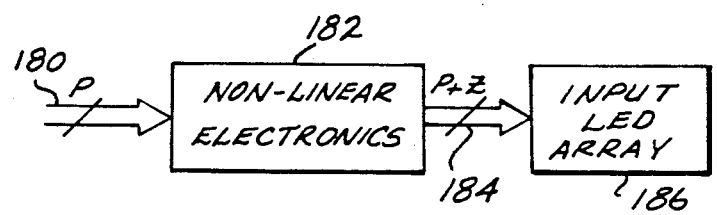

Implementation of hidden layers can be accomplished in a straight forward manner using the system architectures previously described. In particular, two additional steps are required. First, Z hidden neurons are synthesized using Z different nonlinear relationships, and used to calculate the augmented interconnect matrix $T^+$. Second, the electrical input signals provided to the input LED array are passed first through a suitable nonlinear electronic network, as indicated to FIG. 8. Thus P electrical input signals are provided via bus 180 to nonlinear electronics 182, and the electronics generates Z additional signals, each of which is related in a nonlinear way to the P original input signals, to produce P+Z electrical input signals on bus 184. The P+Z electrical input signals are received by input LED array 186, and used to generate the optical input signals.

While the preferred embodiments of the invention have been illustrated and described, variations will be apparent to those skilled in the art. Accordingly, the scope of the invention is to be determined by reference to the following claims.

The embodiments of the invention in which an exclusive property or priviledge is claimed are defined as follows:

1. An optical neural net memory, comprising:
   a spatial light modulator including an array of modulator elements arranged in a plurality of rows and one or more columns, each element comprising an input aperture, an exit aperture, and means for modulating a property of light received at the input aperture to produce modulated light at the exit aperture;
   optical feedback means for combining, for each column, the light exiting from the exit apertures of the elements in the column to produce an optical feedback signal for the column;
   optical input means for receiving one or mor optical signals and one or more optical feedback signals and for conveying each input and feedback signal to the input apertures of the elements of an associated row such that each input and feedback signal is associated with a different row; and
   output means for providing one or more output signals, each output signal having a magnitude corresponding to the intensity of a different one of the feedback signals.

2. The neural net memory of claim 1, wherein the spatial light modulator comprises one or more predetermined feedback rows and one or more predetermined input rows, wherein each input signal is conveyed to the input apertures of the elements of an associated input row, and each feedback signal is conveyed to the input apertures of a corresponding feedback row.

3. The neural net memory of claim 1, further comprising;
   an array of optical sources;
   selection means for selecting one or more optical sources to be active sources;
   means for providing one or more electrical input signals to the selected active sources such that the active sources provide optical input signals;
   and wherein the neural net memory comprises first and second spatial light modulators, each spatial light modulator comprising an array of modulator elements, wherein the optical feedback means includes means for combining, for each composite column comprising a column of the first spatial light modulator and an associated column of the second spatial light modulator, the light exiting from the exit apertures of the elements in the composite column to produce an optical feedback signal for the composite columns, each feedback signal being associated with a different row of the second spatial light modulator, wherein the optical input means compriess first and second optical input means, the first optical input means including means for receiving the optical input signals and for conveying each input signal to the input apertures of the elements of an associated row of the first spatial light modulator, such that the input signal from each source is associated with a different row of the first spatial light modulator, the second optical input means including means for receiving the feedback signals and for conveying each feedback signal to the input apertures of the elements of an associated row of the second spatial light modulator, each feedback signal being associated with a different row of the second spatial light modulator, and switch means for blocking one or more feedback signals such that when a particular row of the first spatial light modulator receives an input signal, the feedback signal is blocked for the corresponding row of the second spatial light modulator.

4. Th neural net memory of claim 1, wherein each modulator element has an optical transmittance and modulates the intensity of light received at the input aperture to produce modulated light at the exit aperture.

5. The neural net memory of claim 4, wherein the neural net memory stores R library vectors each of length L, R being less than or equal to L, and wherein the transmittances of the modulator elements are proportional to the elements of a transmittance matrix T formed according to $$T = F(F^T F)^{-1} F^T$$

where F is a matrix formed from the library vectors.

6. The neural net memory of claim 5, wherein the neural net perform the iteration $$S(m+1) = N \cdot T \cdot S(m)$$

where S() is the state vector indicative of the intensities of the feedback signals, m is a time index, and N is a node operator that forces one or more elements of the state vector to be equal to an input vector $f_P$ indicative of the intensities of the input signals.

7. The neural net memory of claim 5, wherein the neural net performs the iteration $$S_Q(m+1) = T_Q \frac{f_p}{S_Q(m)}$$

where $S_Q()$ is a state vector indicative of the intensities of the feedback signals, $T_Q$ is a matrix representing the rows of the transmittance matrix associated with the feedback signals, and $f_p$ is an input vector indicative of the intensities of the input signals.

8. The neural net memory of claim 1, wherein the optical feedback means comprises a plurality of fiber-optic cables, one fiber-optic cable being associated with each column and its associated row.

9. The neural net memory of claim 1, further comprising an LED array for providing the optical input signals.

10. The neural net memory of claim 1, wherein the optical input means comprises means for focusing each optical input or feedback signal in a direction normal to the associated row and for spreading the optical input or feedback signal in a direction parallel to the associated row.

11. The neural net memory of claim 1, wherein each modulator element has an optical transmitance and modulates the intensity of light received at the input aperture to produce modulated light at the exit aperture, wherein the neural net memory stores R library vectors each of length L, R being less than or equal to L, wherein the transmittances of the modulator elements are proportional to the elements of a transmittance matrix T formed according to $$T = F(F^T F)^{-1} F^T$$

where F is a matrix formed from the library vectors, the R library vectors comprising a plurality of data vectors representing data stored in the neural net memory, and one or more hidden vectors, each hidden vector comprising a nonlinear combination of the data vectors, wherein the neural net memory further comprises a nonlinear electronic circuit connected to receive A electric input signals, the nonlinear electronic circuit comprising means for producing D additional electric input signals such that each additional electric input signal is a nonlinear combination of the first mentioned electric input signals, and wherein the neural net memory further comprises an array of optical sources connected to receive the electrical input signals and to produce corresponding optical input signals.

12. An optical neural net memory, comprising:
substantially identical first and second spatial light modulators, each spatial light modulator comprising a first half and a second half, each half comprising an array of modulator elements arranged in a plurality of columns and one or more rows, each element comprising an input aperture, an exit aperture, and means for modulating a property of light received at the input aperture to produce modulated light at the exit aperture, the columns of the first and second halves being positioned such that they are aligned as extensions of one another;

optical feedback means associated with each spatial light modulator, each feedback means comprising means for combining the light exiting from the exit apertures of the elements of one of the rows from one of the halves of the first spatial light modulator with light exiting from the exit apertures of the elements in a corresponding row of the other half of the second spatial light modulator to produce an optical feedback signal for the rows;

optical input means associated with each spatial light modulator and feedback means, each optical input means including means for receiving one or more optical input signals and one or more optical feedback signals and for conveying each input and feedback signal to the input apertures of the elements of an associated column of the associated spatial light modulator, each input and feedback signal being associated with a different column; and output means for providing first and second output signals corresponding to the first and second feedback signals, respectively.

13. The neural net memory of claim 12, wherein each modulator element has an optical transmittance and modulates the intensity of light received at the input aperture to produce modulated light at the exit aperture.

14. The neural net memory of claim 13, wherein the nueral net memory stores R library vectors each of length L, R being less than L, and wherein the transmittances of the modulator elements are proportional to the elements of a transmittance matrix T formed according to $$T = F(F^T F)^{-1} F^T$$

where F is a matrix formed from the library vectors.

15. The neural net memory of claim 14, wherein the neural net performs the iterations $$S_Q^+(m+1) = T_Q^+ \left[ \frac{f_p^+}{S_Q^+(m)} \right] + T_Q^- \left[ \frac{f_p^-}{S_Q^-(m)} \right] \quad (12)$$

$$S_Q^-(m+1) = T_Q^+ \left[ \frac{f_p^-}{S_Q^-(m)} \right] + T_Q^- \left[ \frac{f_p^+}{S_Q^+(m)} \right] \quad (13)$$

where $S_Q^+()$ and $S_Q^{-1}()$ represent the positive and negative elements, respectively, of a state vector corresponding to the intensities of the feedback signals, $T_Q^+$ and $T_Q^-$ are each matrices representing the positive and negative elements, respectively, of the columns of the transmittance matrix associated with the feedback signals, and $f_p^+$ and $f_p^-$ represent the positive and negative elements, respectively, of an input vector indicative of intensities of the input signals.

* * * * *